(12) United States Patent
Baars et al.

(10) Patent No.: US 7,777,266 B2
(45) Date of Patent: Aug. 17, 2010

(54) CONDUCTIVE LINE COMPRISING A CAPPING LAYER

(75) Inventors: Peter Baars, Dresden (DE); Andreas Eifler, Taucha (DE); Klaus Muemmler, Dresden (DE); Stefan Tegen, Dresden (DE)

(73) Assignee: Qimonda AG, Munich (DE)

( * ) Notice: Subject to any disclaimer, the term of this patent is extended or adjusted under 35 U.S.C. 154(b) by 233 days.

(21) Appl. No.: 11/947,510

(22) Filed: Nov. 29, 2007

(65) Prior Publication Data

US 2009/0140307 A1    Jun. 4, 2009

(51) Int. Cl.
*H01L 29/108*    (2006.01)

(52) U.S. Cl. ............... 257/296; 257/304; 257/305; 257/311; 438/257; 438/259; 438/270

(58) Field of Classification Search ........... 257/296, 257/304, 305, 311; 438/257, 259, 270
See application file for complete search history.

(56) References Cited

U.S. PATENT DOCUMENTS

| | | | |
|---|---|---|---|
| 2004/0036051 A1* | 2/2004 | Sneh | 251/301 |
| 2005/0077563 A1 | 4/2005 | Alsmeier | |
| 2005/0285175 A1* | 12/2005 | Cheng et al. | 257/302 |
| 2006/0258155 A1 | 11/2006 | Sun et al. | |
| 2007/0155119 A1 | 7/2007 | Muemmler et al. | |
| 2008/0230846 A1* | 9/2008 | Obeng et al. | 257/384 |
| 2009/0050959 A1* | 2/2009 | Madson | 257/332 |

FOREIGN PATENT DOCUMENTS

| | | |
|---|---|---|
| DE | 10 224 167 A1 | 12/2003 |
| DE | 11 2004 001 530 T5 | 7/2006 |
| WO | WO 2005 038 904 A1 | 4/2005 |

* cited by examiner

*Primary Examiner*—N Drew Richards
*Assistant Examiner*—Jae Lee

(57) ABSTRACT

An integrated circuit includes a conductive line, the conductive line having a conductive layer made of a metal or a first compound including a metal and a capping layer made of a second compound comprising the metal, the capping layer being in contact with the conductive layer, the first compound being different from the second compound.

14 Claims, 3 Drawing Sheets

CONDUCTIVE LINE COMPRISING A CAPPING LAYER

FIELD OF THE INVENTION

The present specification refers to an integrated circuit comprising a conductive line as well to a method of forming an integrated circuit comprising a conductive line.

BACKGROUND OF THE INVENTION

In integrated circuits, for example memory devices, logic devices, processing devices and others conductive lines are used to connect the respective components of the devices with each other. In order to provide a desired reliability of the devices, short circuits between the conductive lines should be avoided. Accordingly, the formation of these conductive lines is an important issue during the manufacturing process of integrated circuits. For example, a system is needed by which the problem with short circuits is solved or otherwise reduced.

SUMMARY OF THE INVENTION

In an integrated circuit a conductive line may comprise a conductive layer made of a metal or a first compound comprising a metal, and a capping layer made of a second compound comprising the metal, the capping layer being in contact with the conductive layer, and the first compound being different from the second compound. In such an integrated circuit the capping layer may protect the conductive layer during a processing step.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION OF THE INVENTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

Figure 1A:
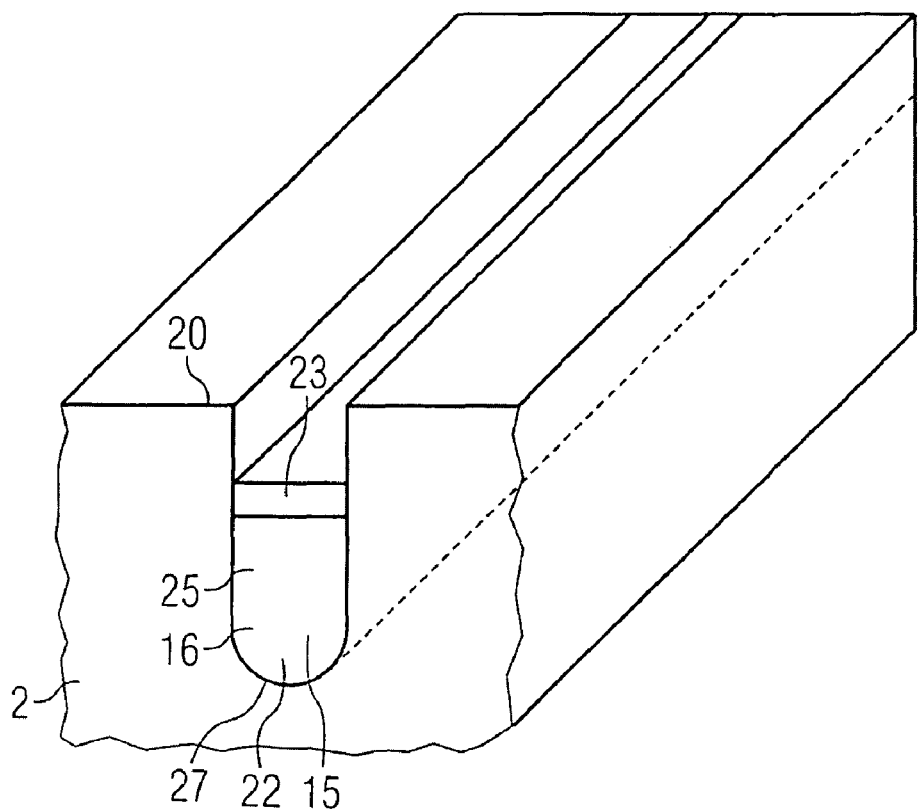
FIG. 1A shows a perspective view of an example of an integrated circuit comprising a conductive line.

FIG. 1A shows a perspective view of an integrated circuit comprising a conductive line according to an embodiment. As is shown, an integrated circuit may comprise a conductive line 16. The conductive line 16 may comprise a conductive layer 22 made of a metal or a first compound comprising a metal. Moreover, the conductive line 16 may further comprise a capping layer 23 which is made of a second metal compound. In one embodiment the capping layer 23 is in contact with the metal layer 22 and the first compound is different from the second compound.

For example, the metal layer 22 may be made of any suitable metal or metal compound. Examples of the metal comprise tungsten, titanium, tantalum, ruthenium, copper, and others. Moreover, the first compound comprises a compound of any of these metals, and includes single elements such as, for example, tungsten, titanium and tantalum. Moreover, in one embodiment the second compound comprises any metal compound which is different from the first compound. For example, if elemental tungsten is taken as the material of the metal layer 22, the capping layer 23 may be made of a tungsten compound such as $WSi_x$, $WO_x$, WN and WC. For example, if the metal layer is made of elemental titanium, the second compound may be made of TiSi. By way of further example, if the metal layer is made of elemental tantalum, the capping may be made of TaN or TaC.

The capping layer may be made of a conductive or an insulating material. For example, the material of the capping layer 23 may be selected so that this material has a smaller sensitivity with respect to a processing step which is to be performed after the formation of the capping layer 23 than the underlying metal layer 22. For example, in the embodiment shown in FIG. 1A, an etching step may be performed so as to etch a material which is disposed above the capping layer 23. In this case, an etchant may be employed which might etch the material of the conductive layer 22 and does not etch the material of the capping layer 23. Due to the presence of the capping layer 23, however, the conductive line 16 will not be attacked by this etching step. Moreover, any kind of oxidation step or treatment may be performed so as to modify the sidewalls of the groove 27 which is formed in the supporting material 2, such as a dielectric layer in one embodiment. Accordingly, due to this treatment or oxidation step, the conductive line 16 will not be affected. A thickness of the capping layer, in one embodiment, may be 5 to 30 nm. Moreover, as is clearly to be understood, the conductive line may comprise further layers. For example, the conductive line may further comprise a conductive layer, for example, comprising polysilicon, doped silicon, conductive polymers, conductive carbon and others which are suitable for use. Moreover, any kind of intermediate layer may be disposed between the metal layer and a supporting material 2, and all such alternatives are contemplated as falling within the scope of the present invention.

As is further shown in FIG. 1A, in one embodiment the conductive line may be disposed in the supporting material 2. For example, the conductive line 16 may be formed so as to be completely buried in the supporting material 2. As an alternative embodiment, the conductive line 16 may as well be disposed above the supporting material 2 or may be partially buried so that a portion of the conductive line 16 is disposed beneath the supporting material, another portion of the conductive 16 line being disposed above the supporting material 2.

Examples of the supporting material 2 comprise any kind of substrate material. The terms "wafer", "substrate", "semiconductor chip" or "semiconductor substrate" used in the context of the present description may include any semiconductor-based structure that has a semiconductor substrate. Wafer and substrate are to be understood to include silicon, silicon-on-insulator (SOI), silicon-on-sapphire (SOS), doped and undoped semiconductors, epitaxial layers of silicon supported by a base crystalline material, and other semiconductor structures. The semiconductor need not be silicon-based. The semiconductor could as well be, among others, silicon-germanium, germanium or gallium arsenide. Various components may already be formed in the substrate. Moreover, different layers may be embedded in the substrate material.

The supporting material may as well comprise any kind of dielectric or insulating material such as an interlayer dielectric or an insulating layer which is used to insulate components from each other. For example, the supporting material 2 may as well comprise an organic material. Further examples include silicon oxide or BPSG (boron doped silicate glass), or other insulative materials, and all such alternatives are contemplated by the invention. According to an embodiment, the term "conductive line" is meant to encompass any kind of conductive line having a longitudinal extension. According to this embodiment the conductive line is distinguished from a conductive filling of a plug or a hole having a longitudinal dimension which is approximately equal to the lateral dimension.

Figure 1B:
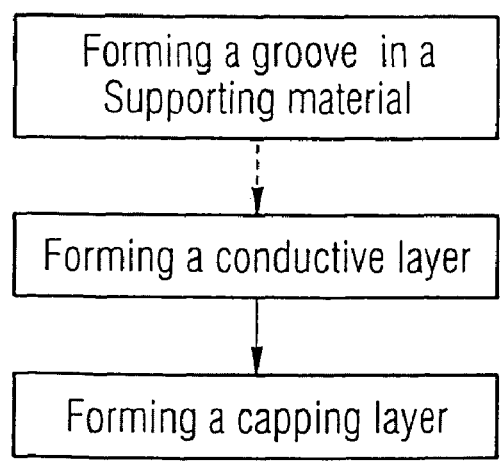
FIG. 1B illustrates an embodiment of a method of forming a conductive line.

FIG. 1B schematically illustrates a method 100 forming a conductive line. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

As is shown in FIG. 1B, the method 100 of forming an integrated circuit comprising providing a conductive line may, in one embodiment, comprise forming a conductive layer made of metal or a first metal compound, and forming a capping layer made of a second metal compound, the capping layer being in contact with the conductive layer, and the first compound being different from the second compound. For example, in one embodiment forming the capping layer may comprise bringing the conductive layer into contact with the material to form the second compound. For example, this may be accomplished by bringing the metal layer into contact with an oxidizing or nitriding atmosphere according to one embodiment. Generally stated, the surface of the metal layer may be brought into contact with a gaseous species. Alternatively, a sacrificial layer may be deposited on top of the metal layer and, optionally, an annealing step may be performed so that a reaction may take place to form the second compound. For example, in one embodiment, an amorphous silicon layer may be deposited on top of the metal layer, followed by an annealing step during which the silicon layer is converted to a metal silicide layer. Alternatively, the metal silicide compound may be formed during the deposition of the silicon layer. Accordingly, in one embodiment the capping layer may be formed in a simple manner by a self-aligned process. To be more specific, in one embodiment the capping layer is formed only at those positions at which the conductive layer is present.

According to an embodiment, and still referring to FIG. 1B, the conductive line may be formed by first forming a groove in a supporting material at 102, followed by filling the conductive layer into the groove at 104. Thereafter, the capping layer may be formed in a manner as has been explained above at 106.

FIGS. 2A to 2D illustrate an embodiment of the invention.

Figure 2A:
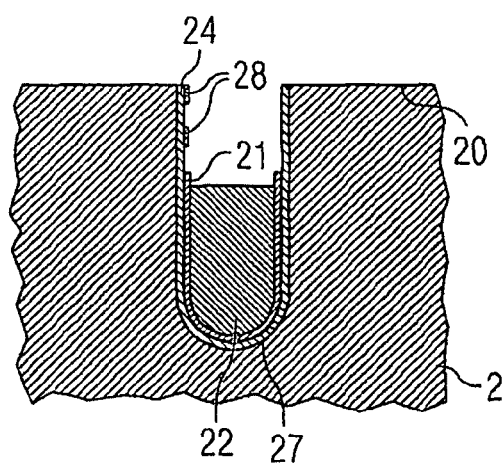
FIGS. 2A to 2D illustrate a method of forming a conductive line.
Figure 2B:
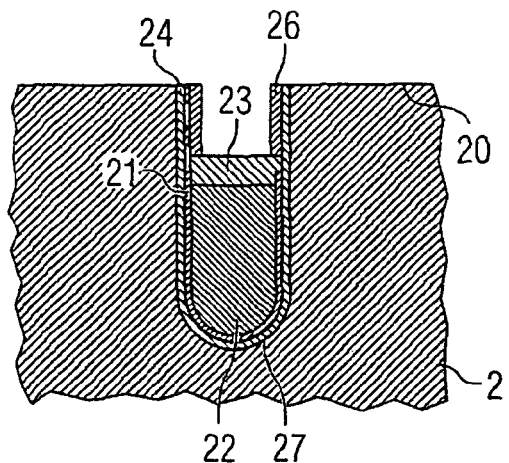
Figure 2C:
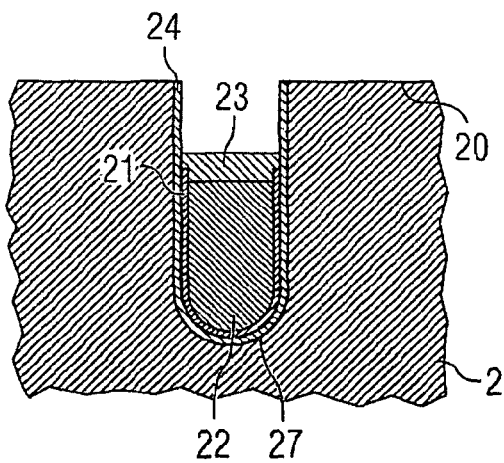

In the embodiment shown in FIG. 2A, first, a groove 27 is formed in the surface 20 of a supporting material 2. The supporting material 2 may be any of the materials as discussed above. For example, if the supporting material 2 is a conductive or semiconductor material, a thin insulating layer such as a gate dielectric layer 24 may be formed to cover the sidewalls of the groove. Thereafter, a suitable conductive intermediate layer 21 may be formed. For example, the intermediate layer 21 may be made of titanium nitride. In one embodiment, the intermediate layer may have a thickness of 1 to 10 nm. Thereafter, the conductive layer 22 may be deposited in the groove 27. For example, the conductive layer 22 may be made of a metal or metal compound as has been discussed above, for example, tungsten. Thereafter, a CMP step may be performed so as to obtain a smooth surface at the surface 20, followed by an etching step for etching back the metal layer 22 as well as the intermediate layer 21 down into the groove 27 below the surface 20. As is illustrated in FIG. 2A, some residues 28 of the intermediate layer 21 may remain on the sidewalls of the groove 27 after this etching step. Thereafter, a capping layer 23 may be formed on top of the conductive layer 22. For example, in one embodiment a capping layer 23 may be formed by depositing a sacrificial layer such as an amorphous silicon layer 26. By way of example, the amorphous silicon layer may be deposited by a CVD (Chemical Vapor Deposition) method in a furnace process or in a batch process. In one embodiment, a thickness of the amorphous silicon layer may be 5 to 20 nm.

Optionally, an annealing step may be performed so as to form a $WSi_x$ layer due to the reaction of the tungsten conductive layer 22 and the amorphous silicon layer 26. This annealing step may be performed at a temperature of approximately 800° C., for example. As a consequence, a capping layer 23 of $WSi_x$ is formed, as illustrate in FIG. 2B. Thereafter, the remaining portions of the sacrificial layer 26 may be removed. Subsequently, any kind of processing step may be performed which might otherwise attack the metal layer 22 but which does not affect the capping layer 23. For example, the remaining sacrificial silicon material may be removed by a wet etching process using NH4OH (H2O:NH3 60:1). Thereafter, the remaining residues 28 of the TiN layer 21 may be removed by a wet etching step, for example, by using hot SC1 (standard clean 1 solution), for example at a temperature of 65° C. Alternatively, a SC2 clean (standard clean 2) may be taken as well. Usually, these etching steps might attack the metal layer 22. Nevertheless, due to the presence of the capping layer 23, the metal layer will not be affected. Accordingly, a wet etching step which removes the residues of the TiN layer very effectively may be used without affecting the metal layer. As an example of a result of the processing to remove the sidewall film and residue, the structure shown in FIG. 2C may be obtained.

As a modification of the process described above, instead of depositing the sacrificial layer 26, the metal layer 22 may be brought into contact with gaseous species. For example, a plasma oxidation step may be performed so as to form a tungsten oxide layer ($WO_x$ layer), for example.

Figure 2D:
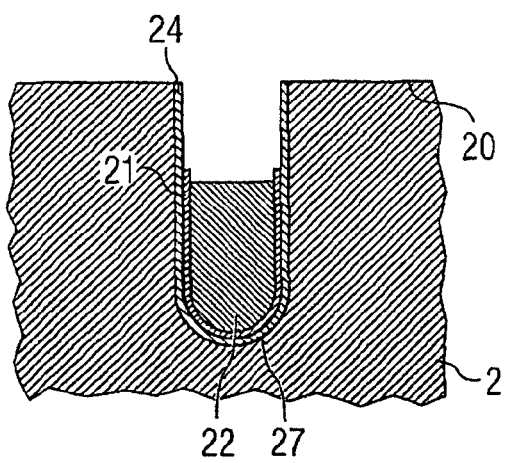

Optionally, thereafter, the capping layer 23 may be removed. FIG. 2D shows a cross-sectional view of an example of a resulting structure. As is shown, now the conductive layer 22 is present in the groove 27.

Figure 3:
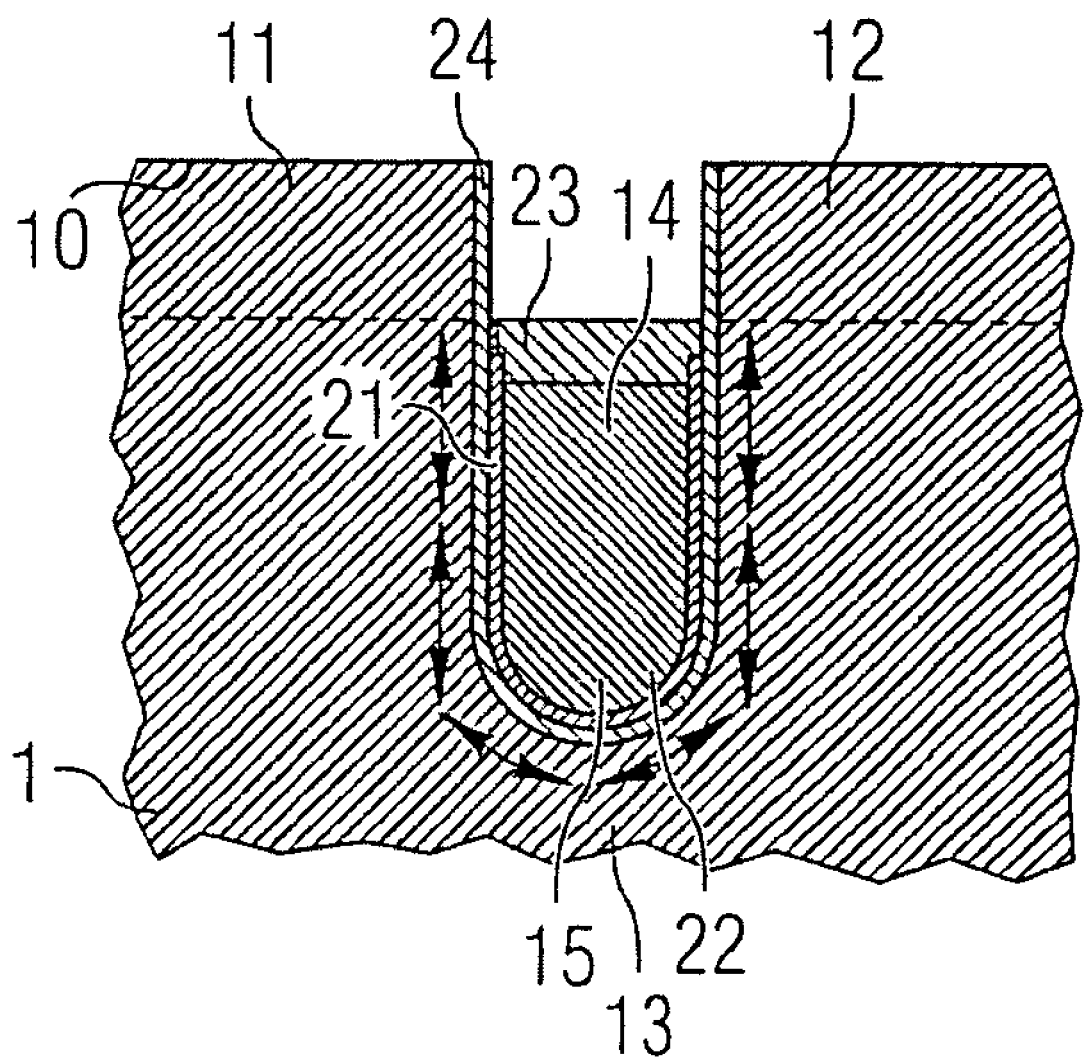
FIG. 3 shows a cross-sectional view of an example of an integrated circuit comprising a conductive line.

FIG. 3 shows a cross-sectional view of an example of an integrated circuit according to an embodiment of the invention. The integrated circuit is formed in a semiconductor substrate, for example, a silicon substrate. The integrated circuit comprises a transistor. As is shown in FIG. 3, the transistor comprises a first and a second source/drain portion 11, 12. A gate electrode 14 is formed in a groove 27 that is formed in a semiconductor substrate or body material 1. The first and second source/drain portions may be disposed on opposing sides of the groove. A gate dielectric layer 24 is disposed between the gate electrode 14 and the substrate material 1. The gate electrode 14 forms part of a corresponding word line 15 in one embodiment. The word line comprises a TiN layer 21 as well as conductive layer 22 such as tungsten. On top of the metal layer 22 a capping layer 23 is disposed. A channel 13 is formed between the first and the second source/drain regions 11, 12. The conductivity of the channel 13 may be controlled by the gate electrode 14. Due to the presence of the capping layer 23 on top of the conductive layer 22 during the manufacture of the word line 15 the sidewalls of the gate groove 27 may be cleaned from any residues of the TiN layer 21 without affecting the conductive layer 22. Moreover, an oxide layer may be formed on the sidewalls of the groove 27 (not shown), for example, by a sidewall oxidation step. During this sidewall oxidation step the conductive layer 22 is not affected.

Consequently, the structure of FIG. 3 may be referred to as a recessed channel array transistor. As can be seen in FIG. 3, the channel of the transistor has both horizontal and vertical components, and thus facilitates a reduction in short channel effects and/or leakage without sacrificing transistor area. In one embodiment such a structure may operate as an access transistor in a memory cell, wherein the gate electrode 14 is coupled to a wordline 15, thereby facilitating a buried wordline architecture, wherein a plurality of such transistors are connected together via a buried wordline. In one embodiment the memory array corresponds to a DRAM array. Furthermore, in one embodiment of the invention the gate and wordline are not polysilicon, but instead are a metal material or metal compound, such as tungsten. Use of the intermediate layer 21, such as TiN facilitates the use of a metal gate such as tungsten without adversely affecting the gate dielectric 24.

In one embodiment of the invention, a plurality of access transistors associated with different DRAM memory cells are formed along a given wordline in a longitudinal wordline direction. In such embodiment, each of the plurality of access transistors have a metal gate electrode residing within a groove, and the wordline comprises a buried wordline that extends in the groove along the wordline direction. While each of the access transistors are coupled to the given buried wordline via their respective gate electrodes, each of the access transistors have source/drain regions that are isolated from one another along the respective wordline direction.

According to a further embodiment, the first and second source/drain portions may as well be disposed on the same side of the gate groove.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method of forming an integrated circuit, comprising:
   forming a groove in a supporting material;
   forming a titanium nitride liner layer in the groove;
   forming a first compound comprising a metal on the liner layer in the groove;
   removing a portion of the liner layer and the first metal compound corresponding to an upper portion of the groove, wherein the liner layer and the first metal compound remain in a lower portion of the groove;
   forming a capping layer on the first metal compound in the groove, wherein the capping layer comprises a second compound of the metal, the second compound being different than the first metal compound, and
   removing any residue of the titanium nitride liner layer on sidewalls of the groove in the upper portion thereof, wherein the first metal compound protected by the second metal compound during the residue removal.

2. The method of claim 1, further comprising removing the capping layer, thereby exposing the first metal compound in the lower portion of the trench.

3. The method of claim 1, wherein the supporting material comprises a semiconductor body, the method further comprising forming an insulating layer in the groove before forming the liner layer, wherein the liner layer is conductive.

4. The method of claim 1, further comprising forming a sacrificial layer on sidewalls of the upper portion of the groove and over the first metal compound prior to forming the capping layer over the first metal compound.

5. The method of claim 4, wherein the sacrificial layer comprises a silicon layer, and wherein forming the capping layer comprises performing a thermal process, thereby causing a portion of the first metal compound to react with the silicon layer thereover to form the second metal compound.

6. The method of claim 1, further comprising:
   bringing the first compound into contact with a sacrificial material; and
   reacting the first compound with the sacrificial material.

7. An integrated circuit, formed by the process of:
   forming a groove in a supporting material comprising a semiconductor body;
   forming a dielectric layer in the groove;
   forming a titanium nitride liner layer on the dielectric layer in the groove;
   forming a first metal compound on the liner layer in the groove;
   removing a portion of the liner layer and the first metal compound corresponding to an upper portion of the groove, wherein the liner layer and the first metal compound remain in a lower portion of the groove;
   forming a capping layer on the first metal compound in the groove, wherein the capping layer comprises a second metal compound that is different than the first metal compound; and removing any residue of the titanium nitride liner layer on sidewalls of the groove in the upper portion thereof, wherein the first metal compound is protected by the second metal compound during the residue removal.

8. The integrated circuit of claim 7, further formed by the process of removing the capping layer, thereby exposing the first metal compound in the lower portion of the trench.

9. The integrated circuit of claim 7, further comprising a sacrificial layer formed by the process of forming a sacrificial layer on sidewalls of the upper portion of the groove and over the first metal compound prior to forming the capping layer over the first metal compound.

10. The integrated circuit of claim 7, wherein the sacrificial layer comprises a silicon layer, and wherein the capping layer is formed by the process of performing a thermal process, thereby causing a portion of the first metal compound to react with the silicon layer thereover to form the second metal compound.

11. The integrated circuit of claim 7, further comprising source/drain regions in the semiconductor body on opposing sides of the groove, thereby forming a transistor and defining a bent shaped cross-section of a channel therebetween in the semiconductor body along the groove.

12. The integrated circuit of claim 11, wherein the first metal compound comprises tungsten.

13. The integrated circuit of claim 11, wherein the transistor comprises an access transistor in a DRAM memory array, wherein a conductive wordline couples to the gate electrode residing in the groove.

14. The integrated circuit of claim 11, wherein the conductive wordline comprises a buried wordline residing in the groove, wherein the groove extends longitudinally in a wordline direction and couples to a plurality of different gate electrodes of different DRAM memory cells along the wordline direction, wherein the different access transistors along the wordline direction have source/drain regions isolated from one another.

\* \* \* \* \*